US012812872B2

(12) United States Patent
Popovici et al.

(10) Patent No.: US 12,812,872 B2
(45) Date of Patent: Nov. 24, 2026

(54) LAYER STACK FOR FERROELECTRIC DEVICE

(71) Applicant: IMEC VZW, Leuven (BE)

(72) Inventors: Mihaela Ioana Popovici, Haasrode (BE); Jasper Bizindavyi, Leuven (BE); Jan Van Houdt, Bekkevoort (BE); Romain Delhougne, Haacht (BE)

(73) Assignee: IMEC VZW, Leuven (BE)

( * ) Notice: Subject to any disclaimer, the term of this patent is extended or adjusted under 35 U.S.C. 154(b) by 485 days.

(21) Appl. No.: 18/349,046

(22) Filed: Jul. 7, 2023

(65) Prior Publication Data

US 2024/0015984 A1 Jan. 11, 2024

(30) Foreign Application Priority Data

Jul. 8, 2022 (EP) .................................... 22183833

(51) Int. Cl.

| | |
|---|---|
| ***H10B 53/30*** | (2023.01) |
| ***H10B 51/30*** | (2023.01) |
| ***H10D 30/01*** | (2025.01) |
| ***H10D 30/69*** | (2025.01) |
| ***H10D 64/01*** | (2025.01) |
| ***H10D 64/68*** | (2025.01) |

(52) U.S. Cl.

CPC ............ *H10B 53/30* (2023.02); *H10B 51/30* (2023.02); *H10D 30/0415* (2025.01); *H10D 30/701* (2025.01); *H10D 64/033* (2025.01); *H10D 64/689* (2025.01)

(58) Field of Classification Search

CPC ........ H10D 1/682; H10D 1/684; H10D 1/688; H10D 1/696; H10D 30/0415; H10D 30/701; H10D 64/033; H10B 51/30; H10B 53/30

See application file for complete search history.

(56) References Cited

U.S. PATENT DOCUMENTS

2021/0057455 A1 2/2021 Nishida et al.
2021/0359082 A1* 11/2021 Kang .................... H10B 53/30
2021/0359100 A1* 11/2021 Maeng .................. H10B 51/00

(Continued)

FOREIGN PATENT DOCUMENTS

CN 116981258 A * 10/2023 ............... H10D 1/68
DE 112017008132 T5 * 7/2020 .......... H10D 64/691

(Continued)

OTHER PUBLICATIONS

International Search Report received in application No. EP 22183833 dated Dec. 7, 2022 in 9 pages.

(Continued)

*Primary Examiner* — Matthew E Warren
(74) *Attorney, Agent, or Firm* — Knobbe, Martens, Olson & Bear, LLP

(57) ABSTRACT

The present disclosure generally relates to a ferroelectric device, and more particularly to a ferroelectric device including a layer stack. According to embodiments, the ferroelectric device comprises a first electrode and a second electrode, and the layer stack arranged between the first electrode and the second electrode. The layer stack comprises a titanium oxide layer, a doped HZO layer arranged on the titanium oxide layer, and a niobium oxide layer arranged on the doped HZO layer.

18 Claims, 7 Drawing Sheets

(56) References Cited

U.S. PATENT DOCUMENTS

2024/0206189 A1 * 6/2024 Tan ........................ H10B 53/30

FOREIGN PATENT DOCUMENTS

WO WO-2023024101 A1 * 3/2023 ........... H10D 64/689
WO WO-2023065195 A1 * 4/2023

OTHER PUBLICATIONS

Chernikova et al., "Improved Ferroelectric Switching Endurance of La-Doped $Hf_{0.5}$ $Zr_{0.5}O_2$ Thin Films" Applied Materials & Interfaces, vol. 10, No. 3, Jan. 24, 2018, pp. 2701-2708.

Gaddam et al, "Ferroelectricity Enhancement in Hf0.5Zr0.5O2 Based Tri-Layer Capacitors at Low-Temperature (350° C.) Annealing Process" IEEE Electron Device Letters, vol. 42, No. 6, Jun. 2021, pp. 812-815.

Hwang et al., "Effect of Insertion of Dielectric Layer on the performance of Hafnia Ferroelectric Devices" IEEE Transaction on Electron Devices, vol. 68, No. 2, Feb. 2021, pp. 841-845.

Qi et al., "Ferroelectricity of as-deposited HZO fabricated by plasma-enhanced atomic layer deposition at 300° C. by inserting $TiO_2$ interlayers", Applied Physics Letters, No. 118, vol. 032906, Jan. 2021, https://doi.org/10.1063/5.0037887.

* cited by examiner

LAYER STACK FOR FERROELECTRIC DEVICE

CROSS-REFERENCE TO RELATED APPLICATIONS

This application claims foreign priority to European Patent Application 22183833.7, filed Jul. 8, 2022, the content of which is incorporated by reference herein in its entirety.

BACKGROUND

Field

The present disclosure generally relates to a ferroelectric device, and more particularly to a ferroelectric device including a layer stack, and a method for fabricating the ferroelectric device.

Description of the Related Technology

In the last years, some publications demonstrated high endurance MFM capacitors for FERAM, and metal ferroelectric insulator semiconductor (MFIS) stacks for FEFET, all based on hafnium zirconate (HZO). The main challenges of such ferroelectric devices, particularly memories, based on HZO are a prolonged wake-up effect and an only modest initial remnant polarization.

A reduction of the wake-up effect may be achieved by a suitable selection of the electrodes of the HZO-based ferroelectric device. For example, electrodes may be made of tungsten (W), tungsten nitride (WN), or molybdenum (Mo). However, the endurance of the ferroelectric device may be reduced to only about $1\times10^5$ to $1\times10^7$ cycles.

On the other hand, an increased endurance of up to about $1\times10^{11}$ cycles and beyond can be achieved for an HZO-based ferroelectric device by using titanium nitride (TiN) electrodes, which may be more easily accessible for CMOS integration and may be associated with lower costs. However, the ferroelectric device may show a prolonged wake-up effect and a more modest remnant polarization.

SUMMARY OF CERTAIN INVENTIVE ASPECTS

In view of the above, an objective of this disclosure is to provide an HZO-based ferroelectric device which shows a higher remnant polarization, a reduced wake-up effect, and an improved endurance—all at the same time. In addition, a low-cost device and the possibility to integrate with CMOS are other objectives of this disclosure.

These and other objectives may be achieved by the solutions provided in the independent claims. Advantageous implementations are defined in the dependent claims.

Generally, this disclosure is based on the understanding that a depinning of domains and their favorable orientation with respect to the applied electrical field, stabilization of the orthorhombic phase on the expense of the tetragonal one, and/or suppression of non-ferroelectric phases (cubic and monoclinic) formation, may be key factors to achieve a larger remnant polarization in a longer range.

This disclosure is also based on the insight that lanthanides and rare-earth doped HZO, which may be ferroelectric materials with high endurance (e.g., about $1\times10^{10}$ cycles or more), may suffer from modest initial polarization. For example, between $1\times10^5$ and $1\times10^7$ switching cycles may be needed to reach the maximum remnant polarization.

A first aspect of this disclosure provides a ferroelectric device comprising: a first electrode and a second electrode; a layer stack arranged between the first electrode and the second electrode, wherein the layer stack comprises a titanium oxide layer, a doped HZO layer arranged on the titanium oxide layer, and a niobium oxide layer arranged on the doped HZO layer.

Accordingly, this disclosure proposes a new kind of layer stack that has at least three layers, which may include titanium oxide as a seed layer for the doped HZO layer and niobium oxide as a cap layer on the doped HZO layer. This layer stack may lead to a reduced wake-up effect and/or an increased remnant polarization. An endurance above $1\times10^{10}$ cycles may be achieved at the same time.

In particular, the titanium oxide layer may provoke a change of the ratio of orthorhombic (002) oriented grains to orthorhombic (111) oriented grains in the doped HZO layer, and thus the doped HZO may comprise grains containing orthorhombic phase with a having a favorable orientation of the polar domains with respect to the applied electrical field. Further, this may achieve a stabilization of the orthorhombic phase on the expense of the tetragonal one. This may further lead to a larger initial and/or maximum remnant polarization. The addition of the niobium oxide layer may also increase the remnant polarization and/or reduce the wake-up effect.

According to an implementation form of the ferroelectric device, the first electrode and the second electrode may comprise at least a titanium nitride (TiN) layer.

The TiN layers may be the layers of the electrodes that are in direct contact with the layer stack. However, this does not exclude other layers, which may be arranged under the TiN layer of the first electrode, or may be arranged above the TiN layer of the second electrode. For example, other metal layers could be included in the electrodes, for example, metal layers made of W and/or tantalum nitride (TaN). Other metal combinations of outer electrode layers could also include W and/or ruthenium (Ru) and/or TaN. Atomic layer deposition (ALD) may be used to manufacture both the first electrode and the second electrode, or to manufacture at least one of the two electrodes. TiN electrodes may reduce device cost, and may facilitate the possibility to integrate the ferroelectric device and its fabrication with CMOS.

According to an implementation form of the ferroelectric device, the titanium oxide layer may be a titanium dioxide ($TiO_2$) layer and the niobium oxide layer may be a niobium pentoxide ($Nb_2O_5$) layer.

High remnant polarization, high endurance, and a low wake-up effect may be achieved with the $TiO_2$ layer as a seed layer for the doped HZO layer, and with the $Nb_2O_5$ layer as a cap layer of the doped HZO.

According to an implementation form of the ferroelectric device, the titanium oxide layer may have a layer thickness in a range of about 0.5 to about 2.5 nm.

According to an implementation form of the ferroelectric device, the doped HZO layer may be doped at least with lanthanum (La) and/or other lanthanides such as praseodymium (Pr), cerium (Ce), gadolinium (Gd), and/or rare earth metals such as yttrium (Y) or scandium (Sc).

According to an implementation form of the ferroelectric device, the doped HZO layer may comprise a ratio of orthorhombic (002) oriented grains to orthorhombic (111) oriented grains that is equal to or larger than about 0.8. This may further increase the remnant polarization achievable for the ferroelectric device.

According to an implementation form of the ferroelectric device, the layer stack may include the titanium oxide layer, the doped HZO layer, and the niobium oxide layer. In some embodiments, the layer stack may further comprise a tungsten trioxide ($WO_3$) layer arranged on the niobium oxide layer. These two alternatives have both shown very good results concerning the increase of the remnant polarization and endurance, while suppressing the wake-up effect.

According to an implementation form of the ferroelectric device, the doped HZO layer may be a ferroelectric layer and may have at least two non-zero remnant polarization charge states.

According to an implementation form of the ferroelectric device, a remnant polarization of the doped HZO layer may be at least 15-60 $\mu C/cm^2$, and an endurance of the doped HZO layer may be equal to or greater than $1\times10^8$ cycles.

According to an implementation form of the ferroelectric device, the ferroelectric device may be a metal-ferroelectric-metal capacitor, a ferroelectric random access memory, and/or a ferroelectric field effect transistor.

A second aspect of this disclosure provides a method for fabricating a ferroelectric device, the method comprising steps of: forming a first electrode; forming a layer stack on the first electrode, wherein forming the layer stack comprises forming a titanium oxide layer, forming a doped hafnium zirconate, HZO, layer on the titanium oxide layer, and forming a niobium oxide layer on the doped HZO layer; and forming a second electrode on the layer stack.

The method of the second aspect may achieve the same advantages as described above for the ferroelectric device of the first aspect. In particular, the method of the second aspect may be used to fabricate a ferroelectric device with a high remnant polarization, a reduced wake-up effect, and/or a high endurance.

According to an implementation form, the method may further comprise an oxygen plasma exposure step and/or an ozone exposure step after the step of forming the doped HZO layer and before the step of forming the niobium oxide layer.

The oxygen plasma exposure or the ozone exposure may further improve the endurance of a ferroelectric device produced with the method of the second aspect.

According to an implementation form of the method, at least one of the titanium oxide layer, the first electrode, and the second electrode, may be formed by atomic layer deposition (ALD).

According to an implementation form of the method, the titanium oxide layer, the first electrode, and the second electrode, may be formed by atomic layer deposition (ALD), which advantageously may allow conformal growth of the layers in 3D structures such as 3D metal-ferroelectric-metal capacitors, ferroelectric random access memories, and/or ferroelectric field effect transistors.

According to an implementation form of the method, the titanium oxide layer may be formed by atomic layer deposition using titanium methoxide and water.

This process may ensure the change in the preferential grain orientation of the doped HZO layer towards orthorhombic (002). As a result of the change in the preferential orientation of the doped HZO layer, the remnant polarization may be boosted by about 24 $\mu C/cm^2$ or more already from the start of endurance cycling, because more grains have preferential orientation with respect to the applied electric field.

According to an implementation form, the method further comprises an anneal step at a temperature of about 375° C. or more after the step of forming the second electrode.

This may facilitate transitions from the tetragonal phase to the polar orthorhombic phase.

Notably, in the claims as well as in the description of this disclosure, the word "comprising" does not exclude other elements or steps and the indefinite article "a" or "an" does not exclude a plurality.

BRIEF DESCRIPTION OF THE DRAWINGS

The above described aspects and implementations are explained in the following description of embodiments with respect to the enclosed drawings.

DETAILED DESCRIPTION OF CERTAIN ILLUSTRATIVE EMBODIMENTS

Figure 1:
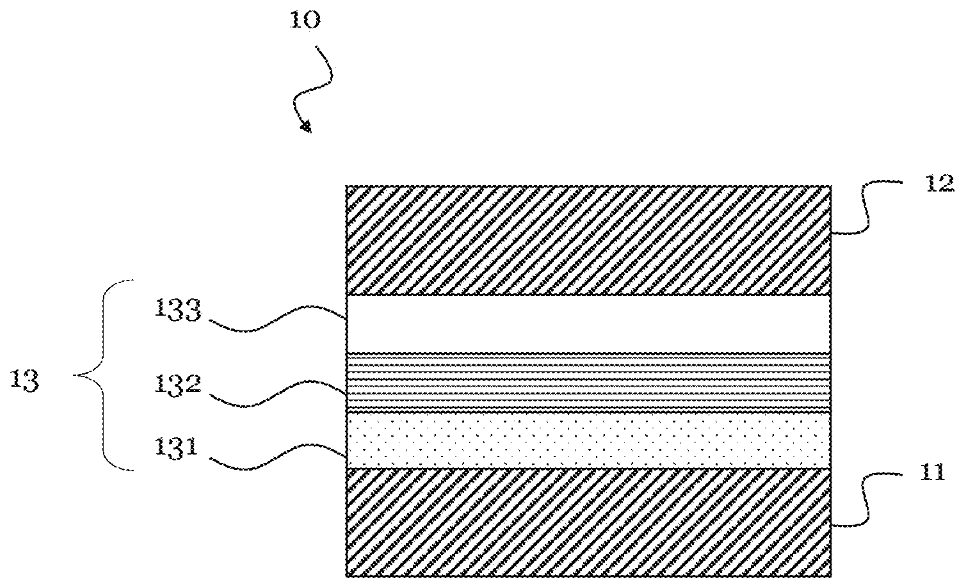
FIG. 1 shows a ferroelectric device according to this disclosure.

FIG. 1 shows a ferroelectric device 10 according to this disclosure. The ferroelectric device 10 may be, or may comprise, at least one of an MFM capacitor, an FERAM, and an FEFET. The ferroelectric device 10 may be at least suitable to fabricate such an MFM capacitor, FERAM, and/or FEFET. The ferroelectric device 10 of this disclosure is designed based on a new kind of layer stack 13 inserted between the two electrodes 11 and 12, wherein the layer stack 13 includes at least three layers, but may also include more than three layers, as described in the following.

The ferroelectric device 10 shown in FIG. 1 comprises, on a substrate, e.g., a silicon substrate, a first electrode 11 and a second electrode 12, which sandwich the layer stack 13. The first electrode 11 and the second electrode 12 may comprise each at least one TiN layer. This TiN layer of either electrode 11, 12 may be in direct contact with the layer stack 13. For example, either electrode 11, 12 may also be made completely or substantially completely of TiN.

The layer stack 13 of the ferroelectric device 10 may be arranged between the first electrode 11 and the second electrode 12. The layer stack 13 may comprise at least a titanium oxide layer 131 (e.g., a $TiO_2$ layer), a doped HZO layer 132 (e.g., a lanthanum (La)-doped HZO layer, also referred to as a La:HZO layer) arranged on the titanium oxide layer 131, and a niobium oxide layer 133 (e.g., an $Nb_2O_5$ layer) arranged on the doped HZO layer 132.

The titanium oxide layer 131 may have a layer thickness in a range of about 0.5 nm to about 2.5 nm. The doped HZO layer may, alternatively or additionally to the La-doping, be doped with at least one of Pr, Ce, Gd, Y, Sc, or another rare earth metal.

As shown in FIG. 1, the titanium oxide layer 131 may be directly arranged on the first electrode 11, and the second electrode 12 may be directly arranged on the niobium oxide layer 133. Thus, the layer stack 13 may consist of the titanium oxide layer 131, the doped HZO layer 132, and the niobium oxide layer 133, as illustrated.

Figure 2:
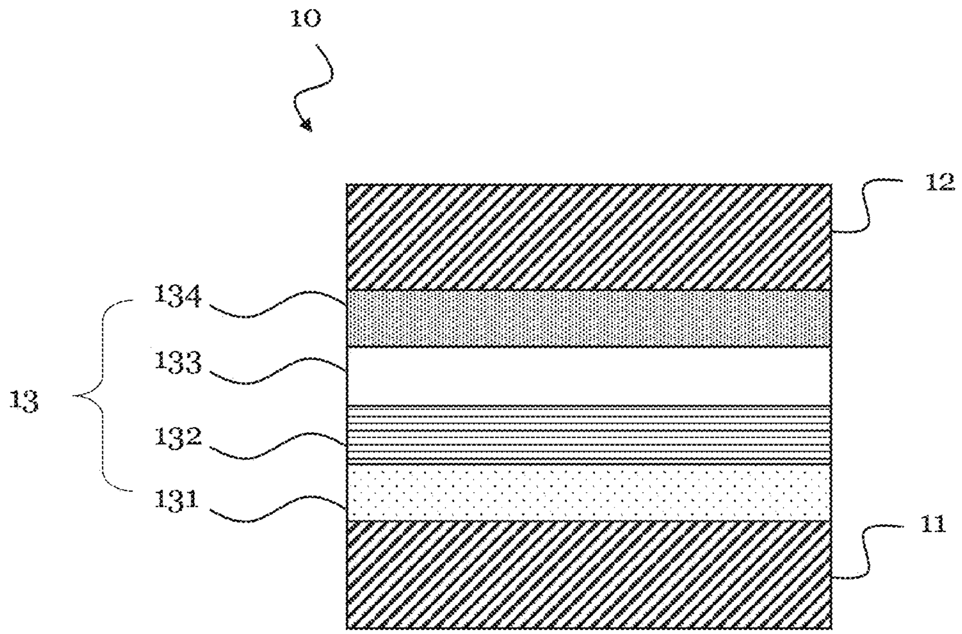
FIG. 2 shows another ferroelectric device according to this disclosure.

As shown in FIG. 2, the layer stack 13 may further comprise an additional layer 134, e.g., a tungsten trioxide layer 134, which may be arranged on the niobium oxide layer 133. The layer stack 13 may consist of the titanium oxide layer 131, the doped HZO layer 132, the niobium oxide layer 133, and the tungsten trioxide layer 134, as illustrated. The second electrode 12 may be arranged on this additional layer, e.g., the tungsten trioxide layer 134. The layer stack 13 may generally comprise three layers or four layers, or even more layers.

Figure 3:
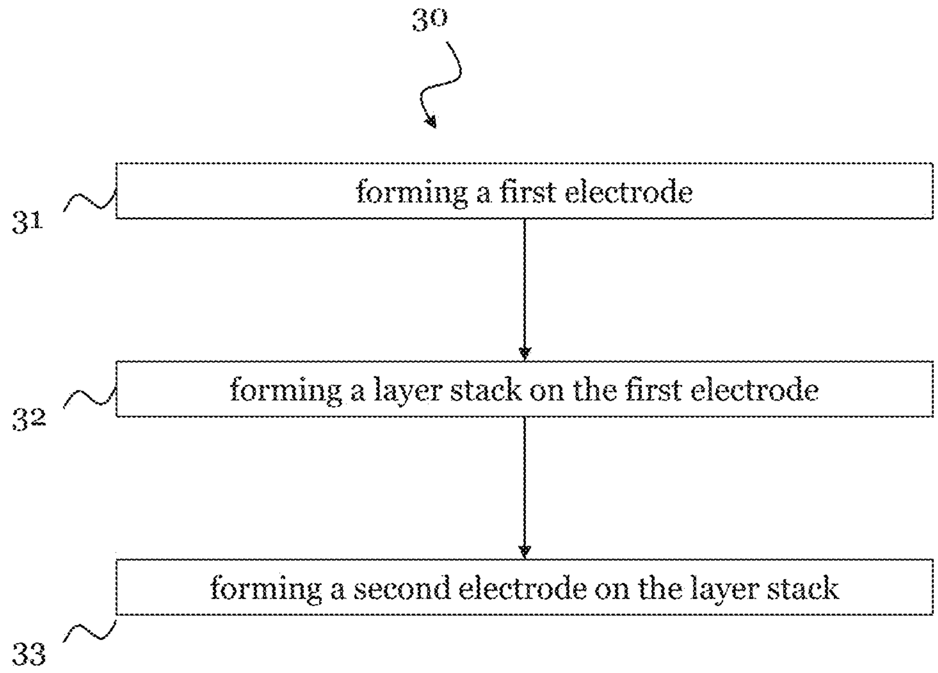
FIG. 3 shows a method for fabricating a ferroelectric device, according to this disclosure.

FIG. 3 shows a flow diagram of a general method 30 that can be used to fabricate the ferroelectric device 10 shown in FIG. 1. The method 30 comprises a step 31 of forming the first electrode 11, a step 32 of forming the layer stack 13 on the first electrode 11, and a step 33 of forming the second electrode 12 on the layer stack 13. The first electrode 11 and the second electrode 12 may each be formed by ALD, for instance, of a TiN material or with at least one layer of TiN. The layer stack 13 may be formed by ALD.

Figure 4:
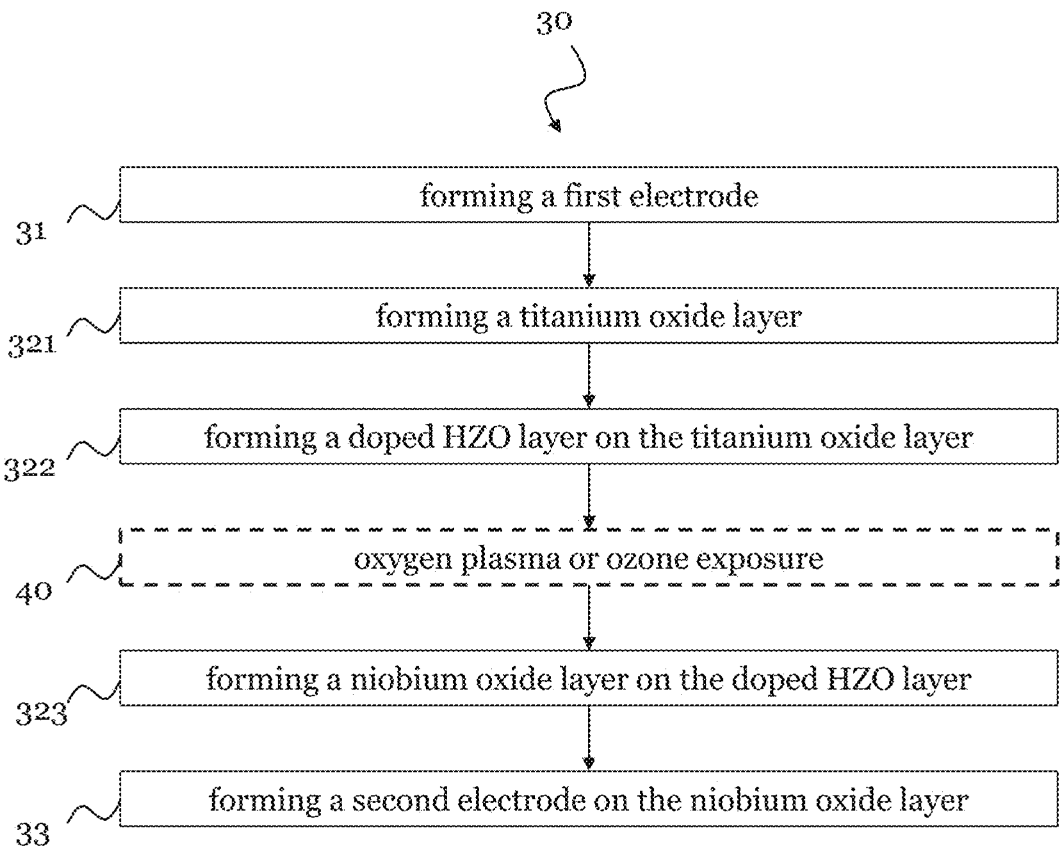
FIG. 4 shows optional details of the method of FIG. 3.

As shown in FIG. 4, the step 32 of forming the layer stack 13 may comprise at least a step 321 of forming the titanium oxide layer 131, a step 322 of forming the doped HZO layer 132 on the titanium oxide layer 131, and a step 323 of forming the niobium oxide layer 133 on the doped HZO layer.

In addition, in order to reach the ferroelectric device 10 shown in FIG. 2, the method 30 may further comprise an optional step of forming the additional layer 134, e.g., the tungsten trioxide layer 134. Of the layers of the layer stack 13, at least the titanium oxide layer 131 may be formed by ALD. In some embodiments, one or more of the other layers of the layer stack 13 may be formed by ALD.

FIG. 4 also shows an optional step 40, which may be carried out between step 322 of forming the doped HZO layer 132 and step 323 of forming the niobium oxide layer 133. The optional step 40 comprises, an oxygen plasma exposure and/or an ozone exposure step, wherein the ferroelectric device 10, as fabricated up to step 322, is exposed to an oxygen plasma and/or an ozone treatment. Optionally, after the step 33, an anneal step may be added to the method 30, wherein the ferroelectric device 10 may be annealed at a temperature above about 375° C.

In summary of the above, this disclosure presents the use of a new kind of tri-layer stack 13 (shown in FIG. 1) or four-layer stack 13 (shown in FIG. 2) for a ferroelectric device 10. For example, the layer stack 13 may comprise a $TiO_2$ layer 131 as a seed layer for a La-doped HZO layer 132, and an $Nb_2O_5$ layer 133 as a cap layer on the La-doped HZO layer 132. When using such a layer stack 13, the wake-up effect of the ferroelectric device 10 as compared to a conventional ferroelectric device such as with only a doped-HZO layer between the electrodes may be strongly suppressed. The remnant polarization (2Pr) of the ferroelectric device 10 may be increased, and an endurance above $1\times10^{10}$ cycles may be achieved.

Figure 5A:
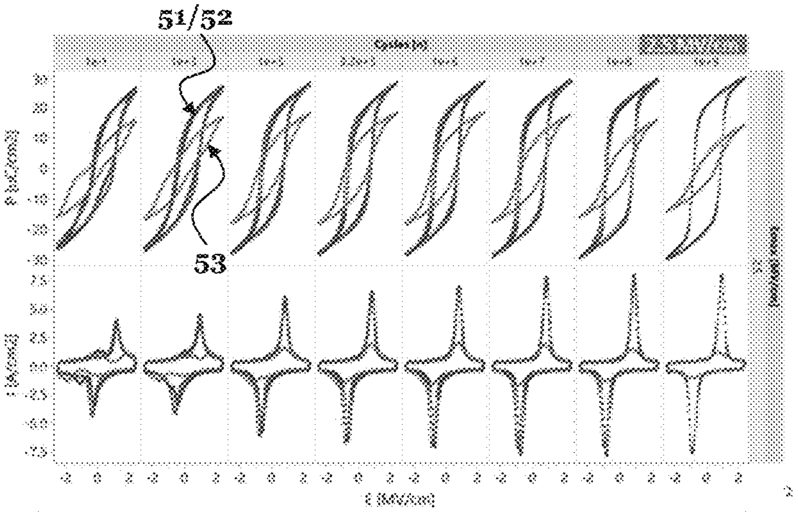
FIGS. 5*a* and 5*b* show polarization-electric field loops and remnant polarization vs. the number of switching cycles, respectively, for a ferroelectric device according to this disclosure.
Figure 5B:
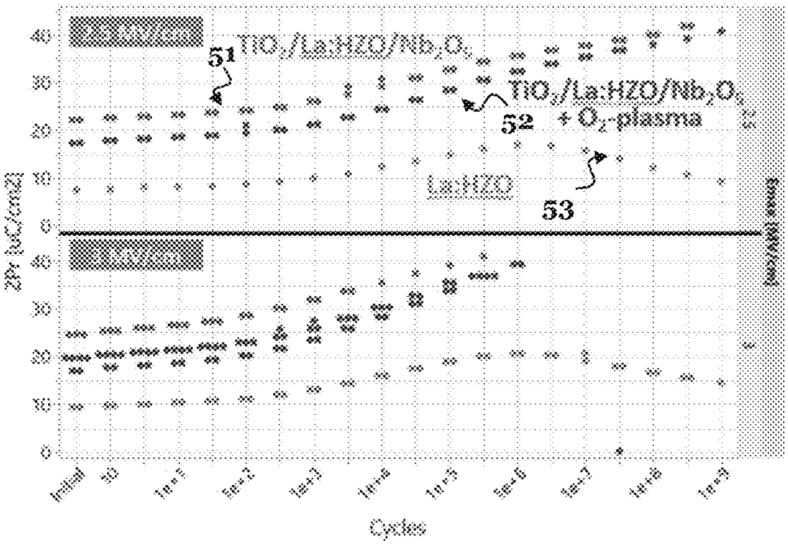

For example, as demonstrated in FIGS. 5*a* and 5*b*, an MFM capacitor (as the ferroelectric device 10) including a tri-layer stack 13 consisting of the $TiO_2$ seed layer 131, the La-doped HZO, layer 132 and the $Nb_2O_5$ cap layer 133, shows a significant increase (see the data set 51) in both the initial remnant polarization (>17 $\mu C/cm^2$) and the maximum remnant polarization (>40 $\mu C/cm^2$) for an electrical field of 2.5 MV/cm applied across the layer stack 13 using the first electrode 11 and the second electrode 12, without signs of fatigue even at $1\times10^9$ cycles. This is compared in FIGS. 5*a* and 5*b* to a MFM capacitor with only a La-doped HZO layer (see data set 53). Notably, higher remnant polarizations are even possible at higher electric fields, for instance, of 3 MV/cm, but this may come at a slight cost of endurance.

A further way to improve the endurance of the ferroelectric device 10 is to apply the above-described oxygen plasma exposure step 40 during the fabrication method 30, in particular, exposing the doped HZO layer 132, e.g., La-doped HZO layer, to the oxygen plasma or ozone. The insertion of the oxygen plasma or ozone exposure 40, after the La-doped HZO layer 132 is grown on the $TiO_2$ seed layer 131 and before the $Nb_2O_5$ cap layer 133 is added onto the doped HZO layer 132, results in an endurance near $1\times10^{11}$ cycles at an electrical field of 2.5 MV/cm, as shown in FIG. 5*b* (see the data set 52). This was notably achieved together with an initial polarization of 15 $\mu C/cm^2$ and a maximum polarization of >40 $\mu C/cm^2$ without signs of fatigue.

In order to maintain the neutrality of the doped HZO layer 132 (containing tetravalent $Hf^{4+}$ and $Zr^{4+}$ ions), oxygen vacancies are induced when doping, for instance, with trivalent $La^{3+}$ dopants. In the early growth stages during an ALD process used to grow the doped HZO layer 132, the tetragonal phase (t-phase) may be predominantly formed, which may transition to the polar orthorhombic phase (o-phase) later during an annealing step. Applying the oxygen plasma or ozone step 40 before the annealing step may affect the level of oxygen vacancies formed in the La-doped HZO layer 132, and may consequently affect the relative tetragonal/orthorhombic phase ratio, which may be reflected in differences observed in remnant polarization.

Figure 6A:
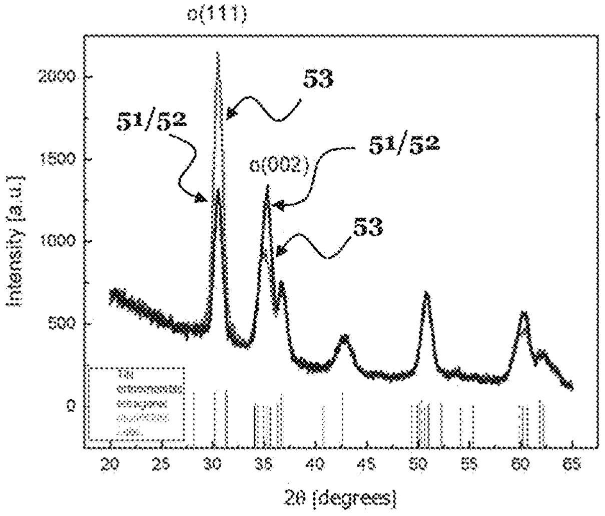
FIGS. 6*a* and 6*b* show grazing incidence X-ray diffraction spectra for a reference ferroelectric device with only a doped HZO layer, for a ferroelectric device according to this disclosure, and for a ferroelectric device according to this disclosure particularly produced with an additional oxygen plasma or ozone exposure step as shown in FIG. 4.
Figure 6B:
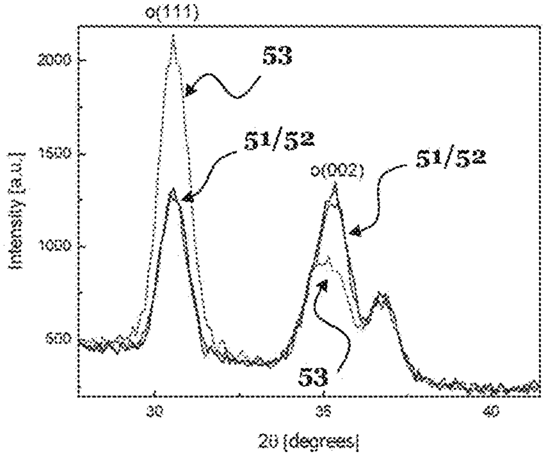

FIGS. 6*a* and 6*b* show X-ray diffraction spectra of the ferroelectric device which were taken after 10 nm of TiN were deposited as second electrode 12, and a 550° C. and 1 min $N_2$ crystallization anneal was performed. A reduction of the main peak orthorhombic (111) was observed, while the grains with preferential orientation along out-of-plane orthorhombic (002) reflection are strongly increased for the case where the $TiO_2$ seed layer 131 was used. FIG. 6*a*, and the zoom in shown in FIG. 6*b*, demonstrate this for both cases, e.g., for the case with oxygen exposure step 40 (see the data set 52) and for the case without the oxygen exposure step 40 (see the data set 51). For example, the doped HZO layer 132 of the ferroelectric device 10 may comprise a ratio of orthorhombic (002) oriented grains to orthorhombic (111) oriented grains that is equal to or larger than 0.8. This is compared in FIGS. 6*a* and 6*b* with a conventional La-doped HZO layer between the electrodes tack (see the data set 53).

Figure 7A:
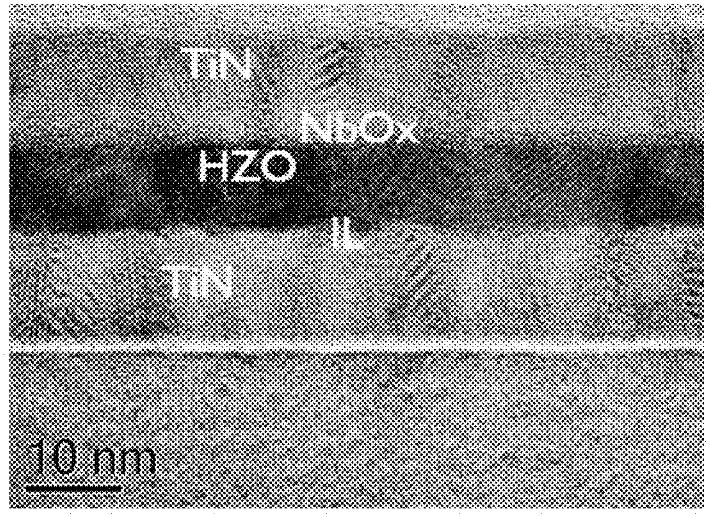
FIGS. 7*a* and 7*b* show a transmission electron microscopy (TEM) image and an energy dispersive spectroscopy (EDS) chemical depth profile, respectively, for a ferroelectric device according to this disclosure.
Figure 7B:
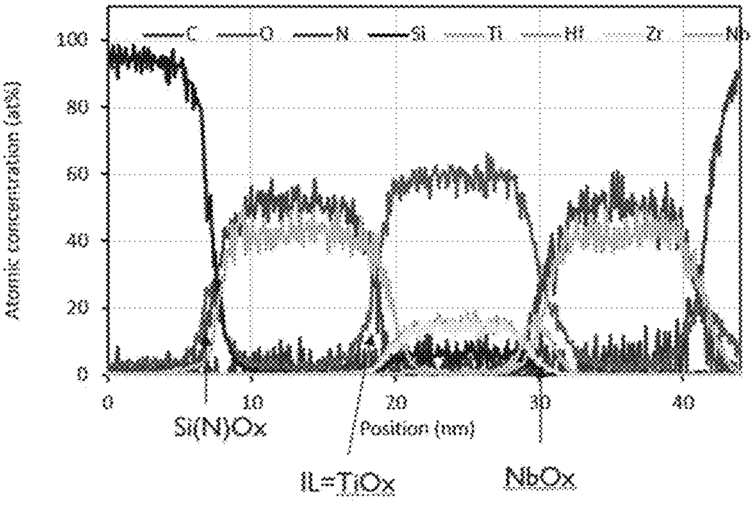

FIGS. 7*a* and 7*b* show a cross sectional transmission electron microscope (X-TEM) image and an EDS chemical depth profile, respectively, for the ferroelectric device which comprises first and second TiN electrodes 11, 12, and a tri-layer stack 13 of $TiO_2$, La-doped HZO, and $Nb_2O_5$. It can be seen that the layers of ferroelectric device 10 are well crystallized, and that little or no diffusion of Ti or Nb into the doped HZO layer 132 can be put in evidence by the EDS.

To conclude the above, according to this disclosure, the insertion of a titanium oxide layer 131 (e.g., a thin $TiO_2$ layer about 1 nm thick that is grown by ALD) between the bottom electrode 11 and the doped HZO layer 132, may lead to a change in the preferential orientation of the grains with orthorhombic (002) reflection surpassing in intensity the orthorhombic (111) main reflection, which appears in randomly-oriented doped HZO grains. Further, the addition of the niobium oxide layer 133 (e.g., an $Nb_2O_5$ cap layer on the doped HZO layer 132) may supply a boost in remnant polarization and/or a reduction of the wake-up effect.

The combination of the doped HZO layer 132 with the two interfacial layers 131 and 133 (e.g., $TiO_2$ and $Nb_2O_5$), as described herein, may be able to circumvent the wake-up problem and/or may boost the remnant polarization even above the values reached with bi-layer stacks.

What is claimed is:

1. A ferroelectric device comprising:

a first electrode and a second electrode; and a layer stack between the first electrode and the second electrode, wherein the layer stack comprises a titanium oxide layer, a doped hafnium zirconate (HZO) layer arranged on the titanium oxide layer, and a niobium oxide layer arranged on the doped HZO layer, wherein the doped HZO layer comprises grains having an orthorhombic (002) surface orientation and grains having an orthorhombic (111) surface orientation, wherein an x-ray diffraction spectrum of the ferroelectric device has a first peak intensity corresponding to an orthorhombic (002) crystallographic plane and a second peak intensity corresponding to an orthorhombic (111) crystallographic plane, and wherein a ratio between the first peak intensity and the second peak intensity is equal to or greater than 0.8.

2. The ferroelectric device of claim 1, wherein each of the first electrode and the second electrode comprises at least a titanium nitride layer.

3. The ferroelectric device of claim 1, wherein the titanium oxide layer comprises a titanium dioxide layer and the niobium oxide layer comprise a niobium pentoxide layer.

4. The ferroelectric device of claim 1, wherein the titanium oxide layer has a thickness of about 0.5 to about 2.5 nm.

5. The ferroelectric device of claim 1, wherein the doped HZO layer comprises a HZO layer that is doped with at least one of a lanthanide or a rare earth metal.

6. The ferroelectric device of claim 5, wherein the lanthanide comprises one or more of lanthanum, praseodymium, cerium or gadolinium.

7. The ferroelectric device of claim 5, wherein the rare earth metal comprises one or both of yttrium or scandium.

8. The ferroelectric device of claim 1, wherein the layer stack consists essentially of the titanium oxide layer, the doped HZO layer, and the niobium oxide layer.

9. The ferroelectric device of claim 1, wherein the layer stack further comprises a tungsten trioxide layer arranged on the niobium oxide layer.

10. The ferroelectric device of claim 1, wherein the doped HZO layer is a ferroelectric layer and has at least two non-zero remnant polarization charge states.

11. The ferroelectric device of claim 1, wherein a remnant polarization of the doped HZO layer is at least 15-60 $\mu C/cm^2$.

12. The ferroelectric device of claim 1, wherein an endurance of the doped HZO layer is equal to or greater than $1\times10^8$ cycles.

13. The ferroelectric device of claim 1, wherein the ferroelectric device is selected from the group consisting of a metal-ferroelectric-metal capacitor, a ferroelectric random access memory or a ferroelectric field effect transistor.

14. A method for fabricating a ferroelectric device, the method comprising:

forming a first electrode;

forming a layer stack on the first electrode, wherein forming the layer stack comprises forming a titanium oxide layer, forming a doped hafnium zirconate (HZO) layer on the titanium oxide layer, and forming a niobium oxide layer on the doped HZO layer; and forming a second electrode on the layer stack, wherein the doped HZO layer comprises grains having an orthorhombic (002) surface orientation and grains having an orthorhombic (111) surface orientation, wherein an x-ray diffraction spectrum of the ferroelectric device has a first peak intensity corresponding to an orthorhombic (002) crystallographic plane and a second peak intensity corresponding to an orthorhombic (111) crystallographic plane, and wherein a ratio between the first peak intensity and the second peak intensity is equal to or greater than 0.8.

15. The method of claim 14, further comprising exposing the doped HZO layer to an oxygen plasma or ozone after forming the doped HZO layer and before forming the niobium oxide layer.

16. The method of claim 14, wherein at least one of the titanium oxide layer, the first electrode, and the second electrode is formed by atomic layer deposition.

17. The method of claim 14, wherein the titanium oxide layer is formed by atomic layer deposition using titanium methoxide and water.

18. The method of claim 14, further comprising annealing the ferroelectric device at a temperature above 375° C. after forming the second electrode.

* * * * *